(12) United States Patent
Oda (10) Patent No.: US 7,397,125 B2
(45) Date of Patent: Jul. 8, 2008

(54) SEMICONDUCTOR DEVICE WITH BONDING PAD SUPPORT STRUCTURE

(75) Inventor: Noriaki Oda, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 309 days.

(21) Appl. No.: 10/761,204

(22) Filed: Jan. 22, 2004

(65) Prior Publication Data

US 2004/0150112 A1    Aug. 5, 2004

(30) Foreign Application Priority Data

Jan. 30, 2003    (JP)    ............................ 2003-021959

(51) Int. Cl.
*H01L 23/48* (2006.01)
*H01L 23/485* (2006.01)
*H01L 23/04* (2006.01)

(52) U.S. Cl. .............................. 257/758; 257/E23.011; 257/E23.02; 257/E23.132; 257/E23.145; 257/700; 257/701; 257/459; 257/774; 257/680; 257/750; 257/762

(58) Field of Classification Search ............ 257/E23.02, 257/E23.145, E23.011, E23.132, E21.582, 257/E21.576, 700, 701, 758, 459, 784, 774, 257/680, 756, 750, 734, 751, 760, 762
See application file for complete search history.

(56) References Cited

U.S. PATENT DOCUMENTS

| | | | |
|---|---|---|---|
| 5,986,343 A | 11/1999 | Chittipeddi et al. | |
| 6,143,396 A | 11/2000 | Saran et al. | |
| 6,232,662 B1 * | 5/2001 | Saran | ........................ 257/750 |
| 6,297,563 B1 | 10/2001 | Yamaha | |
| 6,410,435 B1 * | 6/2002 | Ryan | ........................ 438/687 |
| 6,461,956 B1 * | 10/2002 | Hsuan et al. | ................. 438/622 |
| 6,677,338 B2 * | 1/2004 | Madras et al. | ............ 514/238.8 |
| 6,713,381 B2 * | 3/2004 | Barr et al. | .................... 438/622 |
| 6,731,007 B1 * | 5/2004 | Saito et al. | ................... 257/762 |
| 6,737,345 B1 * | 5/2004 | Lin et al. | ..................... 438/601 |
| 6,746,951 B2 * | 6/2004 | Liu et al. | ..................... 438/627 |
| 6,747,355 B2 * | 6/2004 | Abiru et al. | ................. 257/758 |
| 6,780,757 B2 * | 8/2004 | Suzuki et al. | ............... 438/623 |
| 6,803,302 B2 * | 10/2004 | Pozder et al. | ............... 438/612 |
| 6,838,769 B1 * | 1/2005 | Chittipeddi et al. | ......... 257/758 |
| 6,900,541 B1 * | 5/2005 | Wang et al. | ................. 257/758 |
| 7,122,902 B2 * | 10/2006 | Hatano et al. | ............... 257/762 |
| 7,208,837 B2 * | 4/2007 | Wang et al. | ................. 257/758 |
| 2001/0010408 A1 | 8/2001 | Ker et al. | |
| 2001/0043917 A1 * | 11/2001 | Merril et al. | ............... 424/93.6 |
| 2001/0051426 A1 * | 12/2001 | Pozder et al. | ............... 438/666 |
| 2002/0005582 A1 * | 1/2002 | Nogami et al. | .............. 257/758 |

(Continued)

FOREIGN PATENT DOCUMENTS

JP    03-1538    1/1991

(Continued)

*Primary Examiner*—Alexander Oscar Williams
(74) *Attorney, Agent, or Firm*—Young & Thompson (57) ABSTRACT

A semiconductor device having bonding pads on a semiconductor substrate includes: an upper copper layer that is formed on the lower surface of the bonding pads with a barrier metal interposed and that has a copper area ratio that is greater than layers in which circuit interconnects are formed; and a lower copper layer that is electrically insulated from the upper copper layer and that is formed closer to the semiconductor substrate than the upper copper layer.

21 Claims, 5 Drawing Sheets

U.S. PATENT DOCUMENTS

| | | |
|---|---|---|
| 2002/0047218 A1 | 4/2002 | Liu et al. |
| 2002/0079576 A1* | 6/2002 | Seshan ........................ 257/737 |
| 2002/0163083 A1* | 11/2002 | Hatano et al. ................ 257/762 |
| 2002/0192919 A1* | 12/2002 | Bothra ........................ 438/381 |
| 2003/0020163 A1* | 1/2003 | Hung et al. .................. 257/734 |
| 2003/0047794 A1* | 3/2003 | Watanabe .................... 257/503 |
| 2004/0070042 A1* | 4/2004 | Lee et al. .................... 257/459 |
| 2005/0258484 A1* | 11/2005 | Itou ........................... 257/341 |

FOREIGN PATENT DOCUMENTS

| | | |
|---|---|---|
| JP | 11-54544 | 2/1999 |
| JP | 2000-114309 | 4/2000 |
| JP | 2001-15516 | 1/2001 |
| JP | 2001-267323 | 9/2001 |
| JP | 2001-358169 | 12/2001 |

* cited by examiner

SEMICONDUCTOR DEVICE WITH BONDING PAD SUPPORT STRUCTURE

BACKGROUND OF THE INVENTION

1. Field of the Invention

The present invention relates to a semiconductor device having bonding pads for wire bonding, and to a method of fabricating the semiconductor device.

2. Description of the Related Art

When forming bonding pads over copper interconnects in semiconductor devices of the prior art that employ copper interconnects, the bonding portions are in some cases provided at positions that are shifted from above the copper interconnects (refer to Japanese Patent Laid-Open Publication No. 2001-15516, pp. 4-5, FIG. 2).

Figure 1:
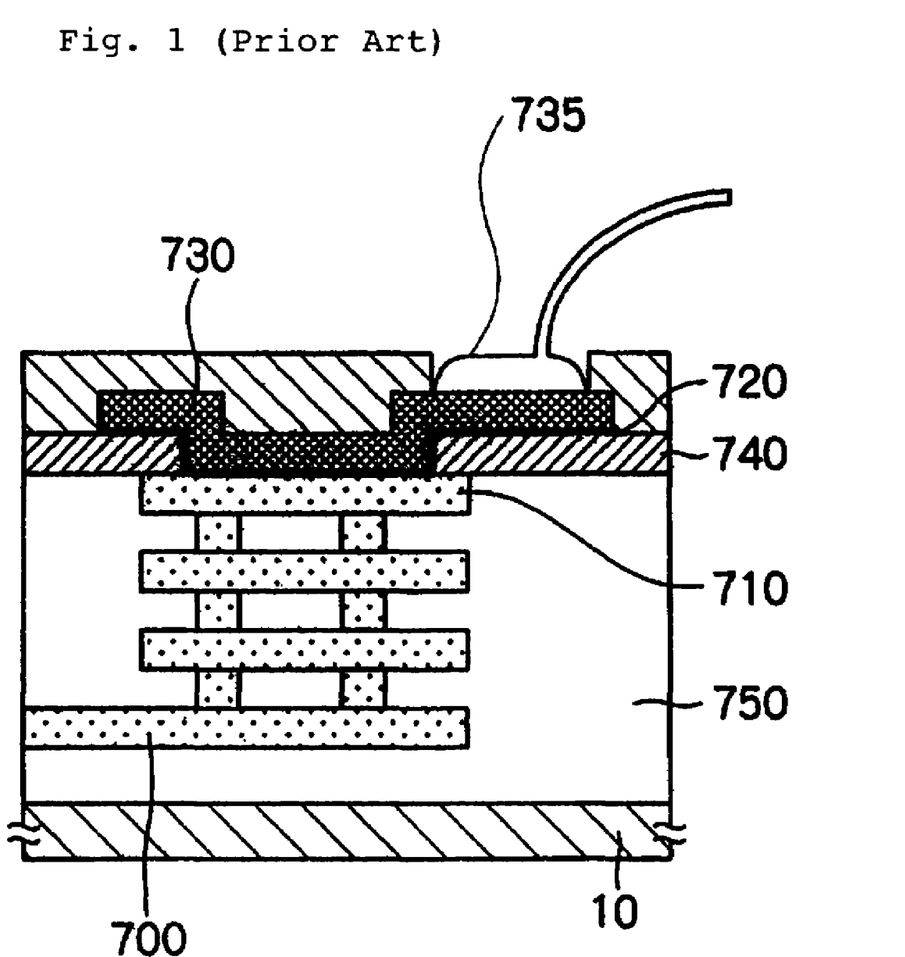
FIG. 1 is a sectional structural view showing one example of the construction of a semiconductor device of the prior art.

FIG. 1 is a sectional structural view showing an example of the construction of a semiconductor device of the prior art. Referring to FIG. 1, a plurality of copper pads are provided on copper interconnects 700 that are formed on semiconductor substrate 10, uppermost layer aluminum interconnect 730 being formed over uppermost layer copper pad 710 with barrier metal 720 interposed. Bonding portion 735 of uppermost layer aluminum interconnect 730 is at a position that is shifted with respect to copper interconnect 700. As a result, stress that occurs when bonding is exerted upon passivation insulation film 740 and interlevel dielectric film 750 that underlie bonding portion 735. The influence of stress upon copper interconnect 700 during bonding can thus be reduced and the exposure of copper interconnects 700 on the surface can be prevented.

Nevertheless, the above-described semiconductor device of the prior art has several drawbacks.

First, because this is a construction in which bonding portions are provided at positions that are shifted with respect to the copper interconnects, the area of the bonding pads is greater than for a case in which the bonding portions are provided immediately above the copper interconnects, and this construction therefore tends to increase chip size.

Further, if a low-k film that has a lower relative dielectric constant than an oxide film is present below the bonding portion, the load of a needle during probing or bonding depresses the bonding pads and may cause cracks in the interlevel dielectric film that underlies the bonding pads or may cause film to peel in the bonding pads.

SUMMARY OF THE INVENTION

The present invention was developed to solve the above-described problems of the prior art and has as an object the provision of a semiconductor device having improved resistance to shock to the bonding pads during probing and bonding (hereinbelow referred to as "shock resistance"), and to a method of fabricating such a semiconductor device.

The semiconductor device of the present invention for achieving the above-described object includes: bonding pads that are formed on a semiconductor substrate; an upper copper layer that is formed on the lower surface of these bonding pads with a barrier metal interposed; and a lower copper layer that is formed closer to the semiconductor substrate than the upper copper layer; wherein the lower copper layer has a copper area ratio that is equal to or less than that of the upper copper layer.

Another semiconductor device of the present invention includes: bonding pads that are formed on a semiconductor substrate; an upper copper layer that is formed on the lower surface of the bonding pads with a barrier metal interposed; and a lower copper layer that is formed closer to the semiconductor substrate than the upper copper layer; wherein the upper copper layer is electrically insulated from the lower copper layer, and the copper area ratio of the upper copper layer is greater than that of circuit interconnect layers that are formed on the semiconductor substrate.

In each of the above-described semiconductor devices, the copper area ratio of the upper copper layer may be at least 70%.

In addition, the planar dimensions of the bonding pads and the upper copper layer may be substantially the same.

Further, the upper copper layer may be constituted by a plurality of copper layers. In such a case, the copper area ratio of each of the copper layers of the upper copper layer may be the same. In addition, the semiconductor device may further include: interlevel dielectric films that are provided between each of the copper layers of the upper copper layer; and via-plugs composed of copper that are embedded in the interlevel dielectric films; wherein each of the copper layers of the upper copper layer are connected by way of the via-plugs. Further, the copper layer pattern of the copper layer that is located in the uppermost layer of the upper copper layer and the via-plugs that are connected to this copper layer pattern may be embedded in a dielectric film that is composed of a first material.

The copper area ratio of the lower copper layer may be at least 15% and not greater than 95%.

The lower copper layer may be composed of a plurality of copper layers. In such a case, the copper area ratio of each of the copper layers of the lower copper layer may be the same. Further, dielectric films composed of a first material may be interposed between each of the copper layers of the lower copper layer. Each of the copper layers of the lower copper layer may be constituted by a copper layer pattern that is embedded in a dielectric film composed of a second material having a lower relative dielectric constant than the first material. The second material may be a softer substance than the first material. Still further, the dielectric films that are composed of the second material may contain any one of: a SiOC film, a silicon carbide (SiC) film, a SiOF film, a porous silicon dioxide ($SiO_2$) film, a porous SiOC film, and a ladder oxide film having a ladder-type hydrogenated siloxane.

A dielectric film that is composed of a third material that has a lower relative dielectric constant than the first material may be interposed between each of the copper layers of the lower copper layer. In such a case, the third material may be a softer substance than the first material. In addition, the dielectric films that are composed of the third material may contain any one of: a SiOC film, a silicon carbide (SiC) film, a SiOF film, a porous silicon dioxide ($SiO_2$) film, a porous SiOC film, and a ladder oxide film having a ladder-type hydrogenated siloxane.

The barrier metal may contain either of titanium nitride (TiN) and tantalum nitride (TaN).

The semiconductor device may further include: internal circuits that are provided on the semiconductor substrate; and auxiliary copper interconnects that are electrically connected to the internal circuits; and these auxiliary copper interconnects may be electrically connected to a portion of the bonding pads by way of via-holes.

In the method of fabricating the semiconductor device of the present invention, the upper copper layer and lower copper layer are formed by a damascene method.

In another method of fabricating the semiconductor device of the present invention, the copper layer pattern of the copper layer that is positioned in the uppermost layer of the upper copper layer and the via-plugs that connect to this copper pattern are formed by a dual damascene method.

The present invention as described in the foregoing explanation takes advantage of one of the characteristics of copper, i.e., that copper has greater elasticity than an oxide film, elasticity is the property to rebound from force that is applied from the outside. In other words, the semiconductor device of the present invention has a structure in which the upper copper layer and lower copper layer below the bonding pads function as shock-resistant layers that impede the transmission of shocks below the bonding pads.

In forms of the present invention in which the copper area ratio of the upper copper layer is at least 70%, shock resistance during probing and bonding is more greatly improved.

In forms of the present invention in which the planar dimensions of the bonding pads and upper copper layer are substantially the same, the contact area between the bonding pads and upper copper layer can be made sufficient.

In forms of the present invention in which the upper copper layer is constituted by a plurality of copper layers, shocks are distributed among each of the copper layers. In addition, shocks are more evenly distributed in forms of the present invention in which the copper area ratios of each of the copper layers of the upper copper layer are the same.

In forms of the present invention in which each of the copper layers of the upper copper layer are connected by way of via-plugs, shocks to the uppermost layer are more easily distributed to the other layers.

In forms of the present invention in which the dielectric film that is composed of a first material and in which the uppermost layer of the upper copper layer and the via-plugs that connect to this uppermost layer are embedded is a hard material, the uppermost layer and the via-plugs that receive the greatest shock during bonding are uniformly supported by a hard dielectric film.

Forms of the present invention in which the copper area ratio of the lower copper layer is at least 15% and not greater than 95% allow a still greater improvement in shock resistance. As a result, the lower copper layer can be used as a circuit interconnect layer having a copper area ratio of at least 15% and at most 95%, and the region underlying the bonding pads can be more effectively utilized.

In forms of the present invention in which the lower copper layer is constituted by a plurality of copper layers, shocks that are conveyed to the lower copper layer are distributed among each of the copper layers. Shocks that are conveyed to the lower copper layer are more evenly distributed by making the copper area ratios of each of the copper layers of the lower copper layer the same.

In forms of the present invention that include dielectric films that are composed of the first material between each of the copper layers of the lower copper layer, the lower copper layer can be more uniformly supported by the dielectric films.

In forms of the present invention in which each of the copper layers of the lower copper layer is constituted by a copper layer pattern that is embedded in a dielectric film that is composed of a second material having a lower relative dielectric constant than the first material, the capacitance between copper layer patterns can be reduced within the same copper layer.

In forms of the present invention in which dielectric films that are composed of a third material that includes a material having a lower relative dielectric constant than the first material are used as the interlevel dielectric films of the lower copper layer, the capacitance between a plurality of interconnect layers that are formed on the same level as the lower copper layer can be reduced.

In forms of the present invention in which either one of titanium nitride (TiN) and tantalum nitride (TaN) are used as the barrier metal, the barrier metal can prevent the mutual diffusion of aluminum and copper between layers overlying and underlying the barrier metal.

In forms of the present invention in which bonding pads are connected to auxiliary copper interconnects, electrical connection between bonding pads and internal circuits can be guaranteed even when shocks that occur during bonding cause cracks in the upper copper layer and thus cause defective connections.

The above and other objects, features, and advantages of the present invention will become apparent from the following description with reference to the accompanying drawings, which illustrate examples of the present invention.

DETAILED DESCRIPTION OF THE PREFERRED EMBODIMENTS

The semiconductor device of the present invention is provided with: an upper copper layer that is formed below bonding pads with a barrier metal interposed; and a lower copper layer that is electrically insulated from this upper copper layer; wherein these copper layers serve as a shock resistant layers.

First Working Example

Figure 2A:
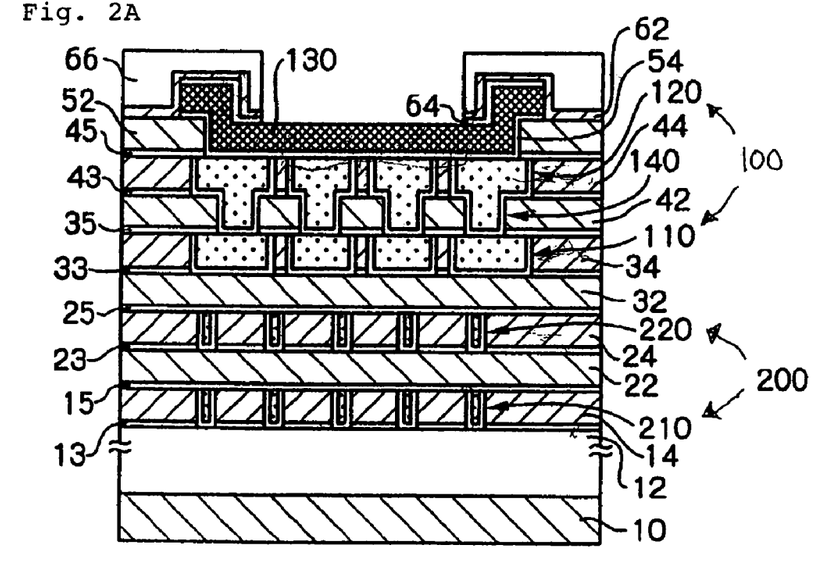
FIG. 2A is a sectional structural view showing the construction of a region that includes a bonding pad of the semiconductor device that is the first working example of the present invention.

FIG. 2A is a sectional structural view showing the configuration of an area that includes a bonding pad of the semiconductor device that is the first working example of the present invention.

Referring now to FIG. 2A, the semiconductor device of the present working example includes upper copper layer 100 for improving shock resistance, this upper copper layer 100 being formed below bonding pad 130 that includes a metal film having aluminum (Al) as its chief component, a barrier metal being interposed between upper copper layer 100 and bonding pad 130. The barrier metal is provided for preventing the aluminum that is contained in bonding pad 130 from reacting with elements that are contained in the upper layer. Upper copper layer 100 and bonding pad 130 have substantially identical planar dimensions (meaning that the planar dimensions are identical within the range of fabrication error), and upper copper layer 100 uniformly supports bonding pad 130 from below.

To provide additional shock resistance, lower copper layer 200 that is electrically insulated from upper copper layer 100 is provided below upper copper layer 100 with oxide film ($SiO_2$ film) 32 interposed. Silicon dioxide ($SiO_2$) film 32 is a dielectric film that is harder than a low-k film. The interposition of this $SiO_2$ film 32 between upper copper layer 100 and lower copper layer 200 prevents denting due to force that is applied during bonding.

Upper copper layer 100 is composed of first upper copper layer 110 and second upper copper layer 120, and first upper copper layer 110 and second upper copper layer 120 are electrically connected by via-plugs 140 that are chiefly composed of copper. Upper copper layer 100 is therefore a two-layer structure, whereby shocks that are exerted upon bonding pad 130 are distributed between each of the layers and an improvement in shock resistance is obtained. The number of copper layers that are formed as upper copper layer 100 may be three or more.

Since second upper copper layer 120 and via-plugs 140 receive most of the force that is applied during bonding, a dielectric film ($SiO_2$ film) that is harder than a low-k film is preferably employed as the dielectric film composed of a first material within which these constituent elements are buried. In the present working example, second upper copper layer 120 and via-plugs 140 are each buried in silicon dioxide ($SiO_2$) films 42 and 44, respectively, these films 42 and 44 being composed of the first material. Silicon dioxide ($SiO_2$) films 42 and 44 are hard, and second upper copper layer 120 and via-plugs 140 are therefore uniformly supported by these silicon dioxide ($SiO_2$) films 42 and 44.

Lower copper layer 200 is composed of two layers, first lower copper layer 210 and second lower copper layer 220, and first lower copper layer 210 and second lower copper layer 220 are insulated by silicon dioxide ($SiO_2$) film 22. The use of a plurality of copper layers for lower copper layer 200 provides the same effects as in upper copper layer 100 that has been described above.

Laminated dielectric film 14, which is composed of a ladder-oxide film and a silicon dioxide ($SiO_2$) film, is interposed between the copper layer patterns of first lower copper layer 210. The ladder-oxide film in this case is L-OX, (a trademark of NEC Electronics Corporation (now in the application process)), which is a low-k film having a ladder-type hydrogenated siloxane. Laminated dielectric film 24 that is composed of L-OX film and a silicon dioxide ($SiO_2$) film is similarly interposed between the copper layer patterns in second lower copper layer 220. Forming laminated dielectric films 14 and 24 from dielectric films (e.g., L-OX films) composed of a second material that has a lower relative dielectric constant than the first material reduces the capacitance between interconnects of the copper interconnects that are formed on the same level as lower copper layer 200.

Although not shown in FIG. 2A, in addition to regions that contain the above-described bonding pads, internal circuits including semiconductor elements such as transistors, resistors, and capacitors and the circuit interconnects for interconnecting these semiconductor elements are also provided on semiconductor substrate 10. The circuit interconnects are formed from conductive layers such as copper layers that are formed on the same layer as either of upper copper layer 100 and lower copper layer 200, diffusion layers that are formed on semiconductor substrate 10, and polysilicon in which impurities are diffused. Connections between bonding pad 130 and internal circuits are realized by way of, for example, upper copper layer 100.

Explanation next regards the planar patterns of upper copper layer 100 and lower copper layer 200. The patterns of upper copper layer 100 and lower copper layer 200 are referred to as "dummy patterns" in the following explanation based on the view that upper copper layer 100 and lower copper layer 200, rather than constituting the interconnects of internal circuits, function as dummy layers for distributing the shock applied to bonding pad 130.

Figure 2B:
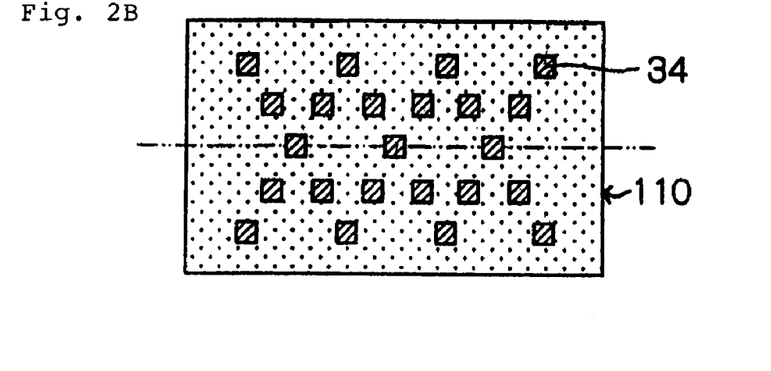
FIG. 2B is a schematic view showing an example of the dummy pattern of the first upper copper layer.

FIG. 2B is a schematic view showing an example of a dummy pattern (planar pattern) of first upper copper layer 110, the sectional structure along the double-dot-single-dash line A-A' being shown in FIG. 2A. The dummy pattern of second upper copper layer 120 is identical to that of first upper copper layer 110 and explanation is therefore here omitted.

As shown in FIG. 2B, square-shaped patterns of a plurality of laminated dielectric films 34 are scattered in the dummy pattern of first upper copper layer 110 such that the overall area density of copper is uniform. The copper area ratio is the proportion of the area that is occupied by copper (copper-occupied area ratio), and shock resistance improves as this ratio increases. In this case, the copper area ratio of the dummy pattern is made greater than that of the copper layer in which the circuit interconnects are formed in order to raise the shock resistance. Based on experimental results obtained to date, the copper area ratio of a dummy pattern is preferably at least 70%. In addition, the copper area ratio of a dummy pattern is preferably not greater than 95% to prevent dishing during the CMP (Chemical Mechanical Polishing) processing of the copper layer.

Figure 2C:
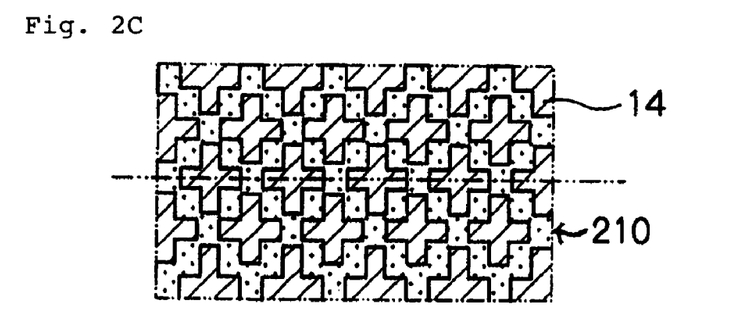
FIG. 2C is a schematic view showing an example of the dummy pattern of the first lower copper layer.

FIG. 2C is a schematic view showing an example of a dummy pattern (planar pattern) of first lower copper layer 210, the sectional structure along double-dot-single-dash line B-B' being shown in FIG. 2A. The dummy pattern of second lower copper layer 220 is identical to that of first lower copper layer 210, and explanation of this dummy pattern is therefore here omitted.

As shown in FIG. 2C, cross-shaped patterns of a plurality of laminated dielectric films 14 are scattered in the dummy pattern of first lower copper layer 210 such that the overall copper area density is uniform. The copper area ratio of first lower copper layer 210 is preferably at least 15% for improving shock resistance, and further, preferably not greater than 95% for the same reasons stated regarding upper copper layer 100.

Since lower copper layer 200 is subjected to less stress during bonding than upper copper layer 100, the copper area ratio of lower copper layer 200 is preferably equal to or less than that of upper copper layer 100.

In addition, the dummy pattern of lower copper layer 200 is electrically insulated from upper copper layer 100, and this dummy pattern may therefore be used as a pattern for circuit interconnects. Using lower copper layer 200 as a circuit interconnect layer in this way enables the effective utilization of the area below bonding pad 130. However, the copper area ratio of lower copper layer 200 in this case is smaller than the copper area ratio of upper copper layer 100.

Further, first lower copper layer 210 and second lower copper layer 220 are electrically insulated by an interlevel dielectric film, but these layers may also be electrically connected by via-plugs.

The method of fabricating the semiconductor device of the above-described working example is next explained with reference to FIG. 2A. The following explanation deals only with the procedures for fabricating elements for improving shock resistance of the bonding pads, these elements being the distinguishing feature of the semiconductor device of the present working example, and detailed explanation regarding the circuit interconnects that are formed on the same level as each of the copper layers that serve as shock resistance layers is therefore omitted.

Semiconductor elements such as transistors, resistors, and capacitors (not shown in the figure) are formed on semiconductor substrate 10, a silicon dioxide ($SiO_2$) film 12 is formed over these elements by a CVD method to a thickness of 300-500 nm as an interlevel dielectric film, following which stopper-SiCN film 13 is further formed to a thickness of 30-50 nm as a film for preventing etching (hereinbelow referred to as an "etching stopper film"). Next, an L-Ox film is formed to a thickness of 300-500 nm over stopper-SiCN film 13 by an application and sintering process and a silicon dioxide ($SiO_2$) film is grown to a thickness of 100-200 nm over this L-Ox film to form laminated dielectric film 14 that is composed of the L-Ox film and silicon dioxide ($SiO_2$) film. A resist pattern is next formed on laminated dielectric film 14 by means of a photolithographic process, following which etching is carried out using this resist pattern as a mask to form a prescribed dummy pattern and interconnect trenches for forming circuit interconnects (not shown in the figure) on laminated dielectric film 14. The resist pattern is then removed.

Next, a barrier metal having a thickness of 30-50 nm and a seed layer having a thickness of 50-200 nm are successively formed on laminated dielectric film 14 in which the dummy pattern and interconnect trenches have been formed, and a copper film having a thickness of 500-1000 nm is additionally formed over these layers by means of an electroplating method. After employing a CMP process to grind the copper film until the upper surface of laminated dielectric film 14 is exposed, cap-SiCN film 15 having a thickness of 30-50 nm is formed as a film for preventing the diffusion of copper. First lower copper layer 210 having the dummy pattern shown in FIG. 2C is thus completed.

After forming first lower copper layer 210, silicon dioxide ($SiO_2$) film 22 having a thickness of 300-500 nm is formed over first lower copper layer 210, and second lower copper layer 220 is formed by the same procedure as the above-described fabrication process of first lower copper layer 210.

Silicon dioxide ($SiO_2$) film 32 having a thickness of 300-500 nm and stopper-SiCN film 33 having a thickness of 30-50 nm are next formed over second lower copper layer 220. Laminated dielectric film 34 that is composed of an L-Ox film having a thickness of 300-500 nm and a silicon dioxide ($SiO_2$) film having a thickness of 100-200 nm is then formed. A resist pattern is next formed on laminated dielectric film 34 by means of a photolithographic process, following which a prescribed dummy pattern and interconnect trenches for forming circuit interconnects not shown in the figure are formed on laminated dielectric film 34 by an etching process. The resist pattern is then removed.

A barrier metal having a thickness of 30-50 nm, a seed layer having a thickness of 50-100 nm, and a copper film having a thickness of 600-1000 nm are next successively formed on laminated dielectric film 34 on which the dummy pattern and interconnect trenches have been formed. The copper film is next ground by a CMP process until the upper surface of laminated dielectric film 34 is exposed, following which cap-SiCN film 35 having a thickness of 30-50 nm is formed. In this way, first upper copper layer 110 having the dummy pattern shown in FIG. 2B is formed.

Silicon dioxide ($SiO_2$) film 42 having a thickness of 300-500 nm, stopper-SiCN film 43 having a thickness of 50-70 nm, and silicon dioxide ($SiO_2$) film 44 having a thickness of 300-500 nm are next successively grown over first upper copper layer 110. A resist pattern for forming via-plugs 140 is next formed on silicon dioxide ($SiO_2$) film 44 by means of a photolithographic process, and etching is carried out using this resist pattern as a mask until cap-SiCN film 35 is exposed to form the via portions, following which the resist pattern is removed. A resist pattern for forming second upper copper layer 120 is then formed on silicon dioxide ($SiO_2$) film 44 by a photolithographic process and etching is carried out using this resist pattern as a mask to form the dummy pattern that is shown in FIG. 2B on silicon dioxide ($SiO_2$) film 44. Then, after removing the resist pattern, cap-SiCN film 35, which is the bottom surface of the vias, is removed by etching.

A barrier metal having a thickness of 30-50 nm, a seed layer having a thickness of 50-100 nm, and a copper film having a thickness of 600-1000 nm are next formed in succession. The copper film is then ground by a CMP process until the upper surface of silicon dioxide ($SiO_2$) film 44 is exposed, following which cap-SiCN film 45 is formed to a thickness of 30-50 nm. In this way, second upper copper layer 120 having the dummy pattern that is shown in FIG. 2B is formed.

Silicon dioxide ($SiO_2$) film 52 having a thickness of 300-500 nm is next formed on cap-SiCN film 45, and a resist pattern for forming openings for connecting second upper copper layer 120 and bonding pad 130 is formed by a photolithographic process on silicon dioxide film 52. Silicon dioxide ($SiO_2$) film 52 and the underlying cap-SiCN film 45 are next etched using the resist pattern as a mask to form openings. Then, after removing the resist pattern, titanium nitride (TiN) film 54 having a thickness of 100-200 nm, this film being a barrier metal, an Al—Cu film (in which the ratio of aluminum to copper is 99.5% to 0.5%) having a thickness of 800-1000 nm, and titanium nitride (TiN) film 64 having a thickness of 50-100 nm, this film being an antireflective coating, are successively formed using a sputtering process.

A resist pattern for forming bonding pad 130 is then formed on titanium nitride (TiN) film 64 by a photolithographic process, following which titanium nitride (TiN) film 64 and the underlying Al—Cu (in which the ratio of aluminum to copper is 99.5% to 0.5%) film and titanium nitride (TiN) film 54 are subjected to etching using this resist pattern as a mask. The Al—Cu (0.5%) film that is left by this etching becomes bonding pad 130. The resist pattern is removed after forming bonding pad 130. Silicon dioxide ($SiO_2$) film 62 is next formed to a thickness of 100-200 nm so as to cover TiN film 64 on bonding pad 130, following which polyimide film 66 is further formed to a thickness of 800-1000 nm on silicon dioxide ($SiO_2$) film 62.

Finally, a resist pattern for forming openings for exposing a prescribed portion of bonding pad 130 (the portion in which bonding is realized) is formed on polyimide film 66 by a photolithographic process, and using this resist pattern as a mask, polyimide film 66 and the underlying silicon dioxide ($SiO_2$) film 62 and titanium nitride (TiN) film 64 are etched to expose bonding pad 130. The semiconductor device of the construction shown in FIG. 2A is thus obtained.

According to the semiconductor device of the present working example described hereinabove, a copper layer having greater elasticity than an oxide film (elasticity being the property by which force that is applied from the outside is repelled) is formed below bonding pad 130 with a barrier metal interposed, whereby a construction is obtained that repels force that is applied by a needle during probing and bonding and that impedes the transmission of shocks below bonding pad 130. The shock resistance of this semiconductor device is therefore improved, and pads are not damaged even when a probing needle is placed on the bonding pad.

In addition, the provision of a copper layer below bonding pad 130 allows the ultrasonic waves for realizing eutectic bonding of a gold wire and bonding pad 130 during bonding to be adequately transmitted to the gold wire and bonding pad 130 without being absorbed by a low-k film such as an L-OX film. As a result, the close adhesion of gold wires and bonding pads is strengthened and the wire-pull strength is increased.

In addition, the actual metal film thickness of the bonding pad portion is the total thickness of the aluminum and the copper layer below the bonding pad, whereby the hardness against probing and bonding is further increased. As a result, the load applied in the vicinity of the underlying L-OX film can be reduced and the occurrence of cracks in the interlevel dielectric film can be prevented.

Second Working Example

In the construction of the above-described first working example, the connection of the bonding pads and internal circuits is realized by way of the upper copper layer, but a construction is also possible in which the bonding pads are connected to auxiliary copper interconnects that are connected to the internal circuits. Explanation next regards a semiconductor device in which this type of connection structure is applied.

Figure 3:
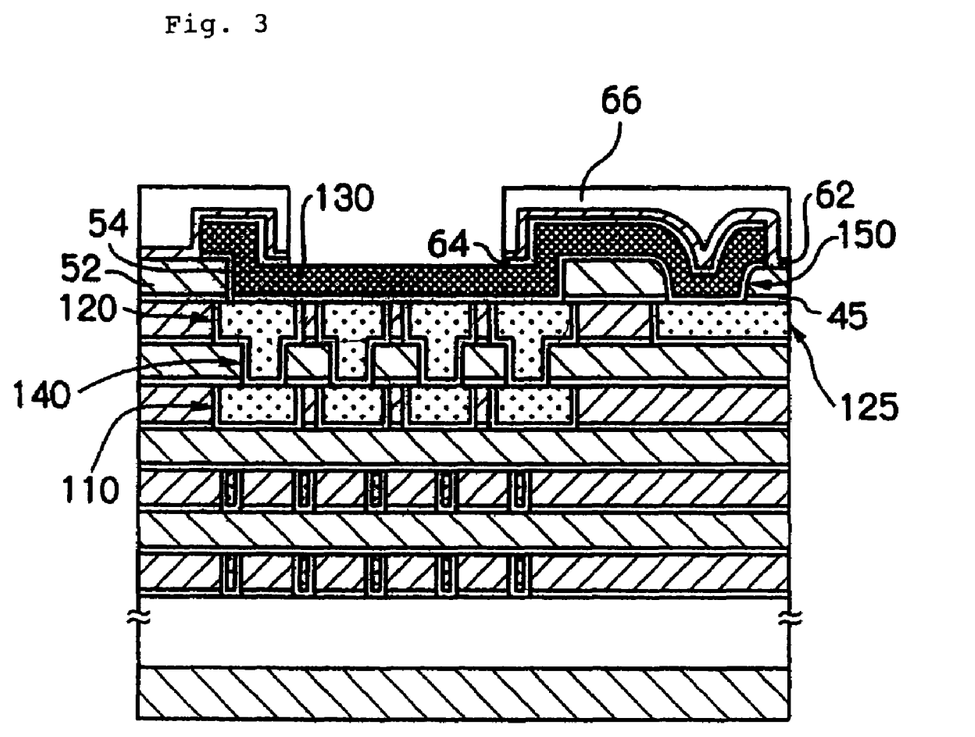
FIG. 3 is a sectional structural view of the semiconductor device that is the second working example of the present invention.

FIG. 3 is a sectional structural view of the semiconductor device that is the second working example of the present invention. As shown in FIG. 3, in the semiconductor device of this working example, auxiliary copper interconnect 125 that is connected to internal circuits is formed on the same level as second upper copper layer 120. Auxiliary copper interconnect 125 and bonding pad 130 are electrically connected by way of via-hole 150. The construction is otherwise basically the same as the construction of the above-described first working example.

Explanation next regards the method of fabricating the semiconductor device of the present working example. The following explanation is limited only to those portions that distinguish this working example, and detailed explanation regarding steps that are similar to steps in the first working example are omitted.

The semiconductor device is fabricated by the same procedures as in the first working example up to the formation of first upper copper layer 110. After forming first upper copper layer 110, trenches for forming auxiliary copper interconnects 125 are formed in silicon dioxide film 44 that is shown in FIG. 2A, and auxiliary copper interconnects 125 are formed when forming second upper copper layer 120. Then, when forming a resist pattern on silicon dioxide (SiO$_2$) film 52 for providing openings for connecting second upper copper layer 120 and bonding pad 130, a pattern is included in this resist pattern for forming via-holes 150 for connecting auxiliary copper interconnects 125 and bonding pads 130. Titanium nitride (TiN) film 54, bonding pads 130, titanium nitride (TiN) film 64, silicon dioxide (SiO$_2$) film 62, and polyimide film 66 are subsequently formed by the same procedures as the first working example.

In the semiconductor device of the present working example, the following effects are exhibited in addition to the effects that were described in the first working example. If cracks occur in second upper copper layer 120 due to shocks to bonding pads during probing and bonding, it is anticipated that electrical conduction between second upper copper layer 120 and internal circuits cannot be guaranteed in the construction of the first working example. In the present working example, however, electrical conduction between bonding pad 130 and internal circuits by way of via-holes 150 and auxiliary copper interconnects 125 can be guaranteed even when such cracks occur.

Further, in the present working example, upper copper layer 100 and internal circuits need not be connected because bonding pads 130 are connected to internal circuits by way of auxiliary copper interconnects 125.

In addition, although auxiliary copper interconnects 125 are formed on the same level as second upper copper layer 120 in the foregoing explanation, the present invention is not limited to this form, and auxiliary copper interconnects 125 may also be formed on the same level as other conduction layers such as, for example, first upper copper layer 110.

Third Working Example

A plurality of bonding pads can be arranged in the construction of the above-described second working example. Explanation here regards a semiconductor device in which this type of construction is applied.

Figure 4A:
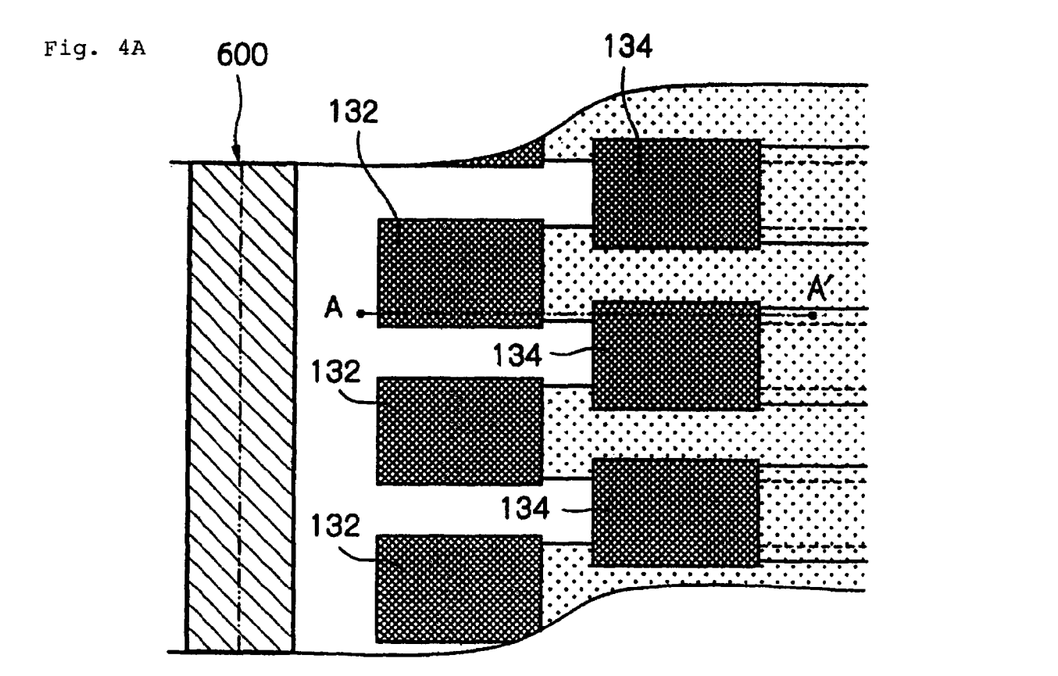
FIG. 4A is a plan view of the semiconductor device that is the third working example of the present invention.
Figure 4B:
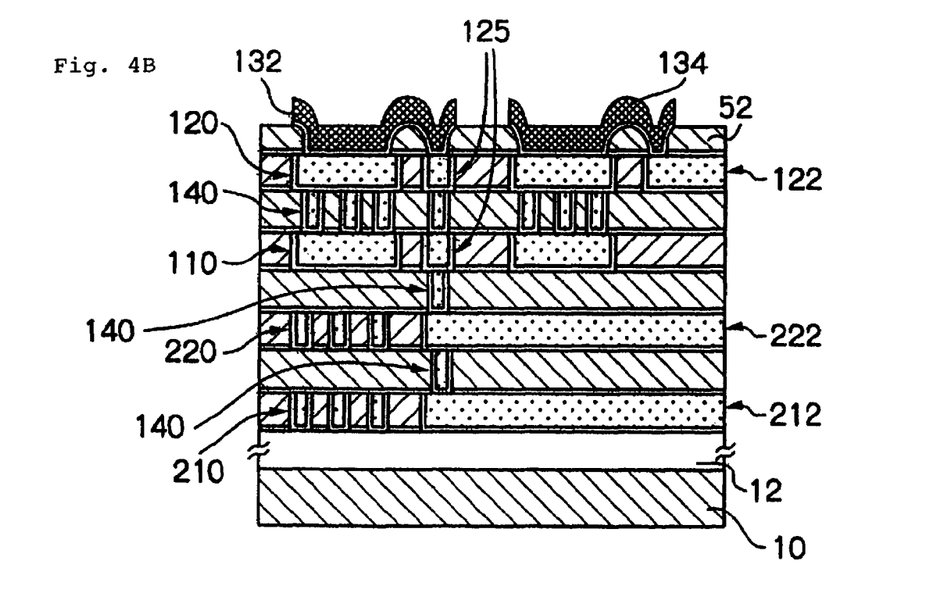
FIG. 4B is a sectional structural view showing the portion along double-dot-single-dash line A-A' in FIG. 4A.

FIG. 4A is a plan view of the semiconductor device that is the third working example of the present invention, and FIG. 4B is a sectional view of the structure in along the double-dot-single-dash line A-A' in FIG. 4A. In these figures, FIG. 4A and FIG. 4B, titanium nitride (TiN) film 64, silicon dioxide (SiO$_2$) film 62, and polyimide film 66 that were shown in FIG. 2A are formed on bonding pads 130, but this construction is here omitted for the sake of expediency.

As shown in FIG. 4A, the semiconductor device of the present working example is a construction in which outer pads 132, which are bonding pads that are close to scribe line 600, and inner pads 134, which are bonding pads that are closer to the center of the chip than outer pads 132, are aligned along different lines. The sectional configuration of a region that includes both these outer pads 132 and inner pads 134 is the construction shown in FIG. 4B that is next described.

First lower copper interconnects 212 for circuit interconnects are formed on the same level as first lower copper layer 210. Second lower copper interconnects 222 for circuit interconnects are formed on the same level as second lower copper layer 220. Second upper copper interconnects 122 for circuit interconnects are formed on the same level as second upper copper layer 120.

Second upper copper layer 120, first upper copper layer 110, second lower copper layer 220, and first lower copper layer 210 are formed as shock resistance layers below outer pads 132. Outer pads 132 are connected to first lower copper interconnects 212 and second lower copper interconnects 222 by way of auxiliary copper interconnects 125 and via-plugs 140.

Second upper copper layer 120 and first upper copper layer 110 are formed below inner pads 134 as shock resistance layers. Inner pads 134 are connected to second upper copper interconnects 122, which constitute the auxiliary copper interconnects.

Second lower copper layer 220 and first lower copper layer 210 may also be provided below inner pads 134. In this case, second lower copper layer 220 is provided to prevent shorts between adjacent second lower copper interconnects 222. First lower copper layer 210 has the same construction.

In the semiconductor device of the present working example, as with the second working example, electrical conduction between bonding pads and internal circuits by way of auxiliary copper interconnects 125 can be guaranteed for outer pads 132 and inner pads 134 even when cracks occur in the bonding pads due to shocks to the bonding pads during probing and bonding whereby adequate electrical conduction cannot be obtained between second upper copper layer 120 and bonding pads.

Fourth Working Example

In each of the above-described working examples, SiOC film, which is the third dielectric film that includes a material of lower relative dielectric constant than the first material, can be used in place of a silicon dioxide ($SiO_2$) film as the interlevel dielectric film of the lower copper layer. Explanation is now given for an example in which this type of construction is applied in the semiconductor device that is shown in FIG. 3.

Figure 5:
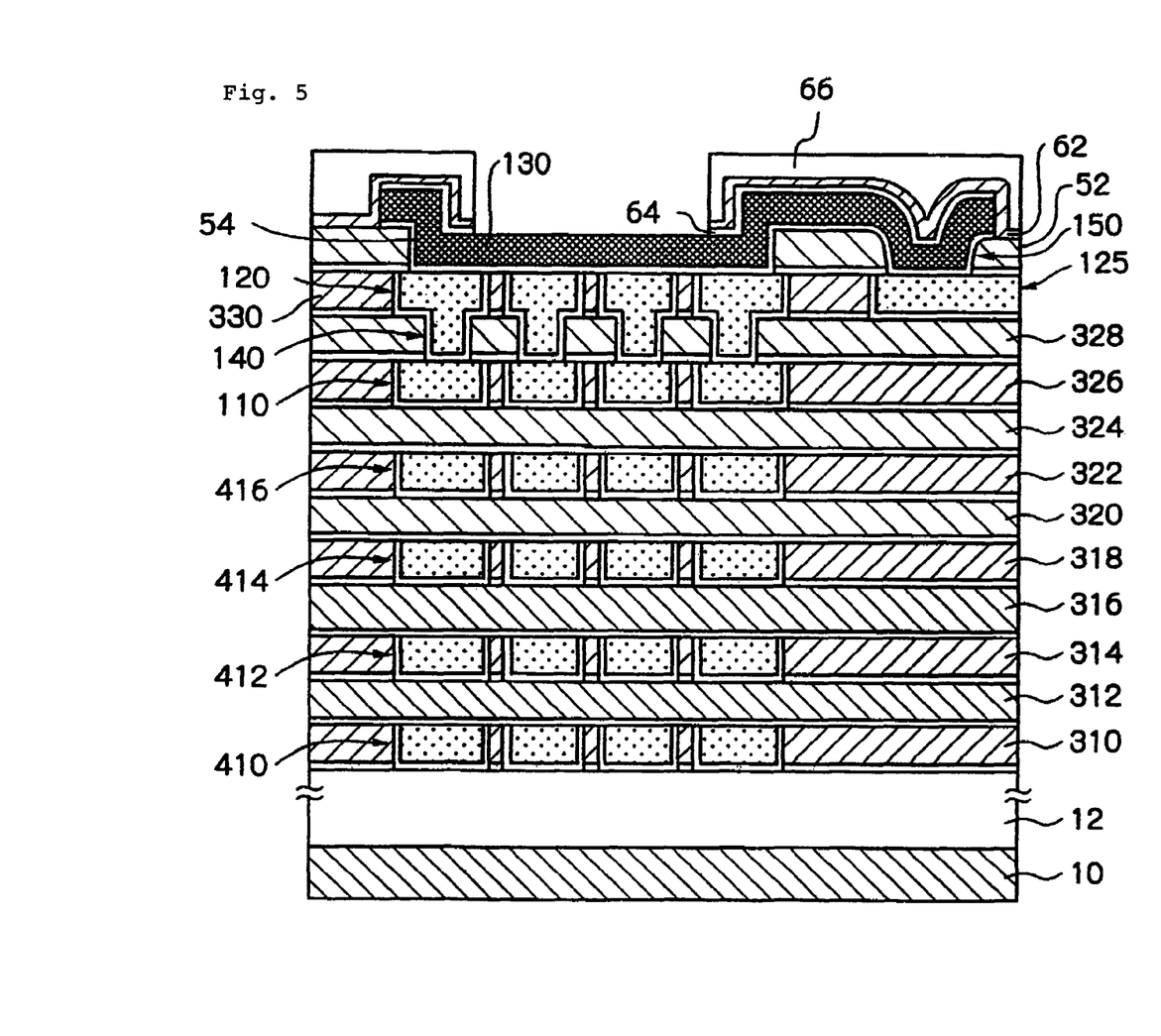
FIG. 5 is a sectional structural view showing the configuration of the semiconductor device that is the fourth working example of the present invention.

FIG. 5 is a sectional structural view showing the construction of the semiconductor device that is the fourth working example of the present invention. In the semiconductor device of the present working example, the copper area ratios of the upper copper layer and lower copper layer are substantially equal. The upper copper layer and the upper portion of the upper copper layer are as shown in FIG. 2B.

As shown in FIG. 5, the lower copper layer is composed of four layers: first lower copper layer 410, second lower copper layer 412, third lower copper layer 414, and fourth lower copper layer 416. These four layers are constituted by patterns that are similar to the dummy pattern of first upper copper layer 110 that was shown in FIG. 2B.

Laminated dielectric film 310 is interposed in first lower copper layer 410, laminated dielectric film 314 is interposed in second lower copper layer 412, laminated dielectric film 318 is interposed in third lower copper layer 414, and laminated dielectric film 322 is interposed in fourth lower copper layer 416. Laminated dielectric films 310, 314, 318, and 322 are all composed of L-Ox films and silicon dioxide ($SiO_2$) films.

SiOC film 312 is interposed between first lower copper layer 410 and second lower copper layer 412, SiOC film 316 is interposed between second lower copper layer 412 and third lower copper layer 414, and SiOC film 320 is interposed between third lower copper layer 414 and fourth lower copper layer 416. SiOC films 312, 316, and 320 are interlevel dielectric films.

According to the semiconductor device of the present working example, the copper area ratios of each of the upper copper layer and lower copper layer are substantially equal, and the copper area ratios of each of the copper layers that constitute the upper copper layer and the lower copper layer are also substantially equal. This construction affords a more even distribution of shocks and allows a greater improvement in shock resistance.

In addition, because SiOC films 312, 316, and 320 are low-k films, capacitance between interconnect layers can be reduced when interconnect layers are formed in the same level as at least two copper layers of the four copper layers, i.e., first lower copper layer 410, second lower copper layer 412, third lower copper layer 414, and fourth lower copper layer 416.

Although laminated dielectric films 310, 314, 318, 322, and 326 are composed of L-Ox films and silicon dioxide films in the present working example, these films can be also constituted by SiOC films.

Explanation next regards the results of investigating the pull strength of bonding wires after bonding, i.e., the results of a wire-pull test, these results being the results of comparison of the previously described semiconductor device of the prior art and each of the semiconductor devices having the constructions of the above-described first to fourth working examples.

In a wire-pull test, bonding wires are pulled upward and connections are judged to be defective if a wire breaks, a ball such as gold or solder, or bonding pad peels off under a force of less than 4 gf. In the semiconductor device of the prior art that was shown in FIG. 1, the defective ratio was approximately 10% when interlevel dielectric film 750 was a silicon dioxide ($SiO_2$) film, and the defective ratio was approximately 20% when interlevel dielectric film 750 was a SiOC film. In contrast, the defective ratio was 0% for all of the first to fourth working examples.

The constructions of the above-described first to fourth working examples and fabrication methods are only examples of the present invention, and the present invention can be modified as appropriate within the range that does not depart from the gist of the invention. For example, upper copper layer 100 and lower copper layer 200 may be constituted by a plurality of layers other than two layers or four layers. When the upper copper layer is a plurality of layers, that is, the number of the upper copper is n, the nth copper layer (where n is a natural number equal to or greater than 2) being the uppermost layer in a construction is preferably adopted from the standpoint of improving shock resistance in which at least the nth copper layer and the via-plugs are embedded in a dielectric film that is composed of the first material.

In addition, each of upper copper layer 100 and lower copper layer 200 may also be a single layer. In such a case, either of upper copper layer 100 and lower copper layer 200 may also serve as a circuit interconnect layer.

When upper copper layer 100 and lower copper layer 200 are dummy layers, the dummy patterns of these layers are not limited to the shapes that are shown in FIG. 2B and FIG. 20, and other patterns may be applied such that the area density of copper is approximately uniform.

In addition, although the formation of via-plugs 140 and second upper copper layer 120 was realized by a dual damascene method, a single damascene method (also referred to as simply "a damascene method") may also be employed. When a damascene method is used, via-plugs 140 and second upper copper layer 120 are formed separately.

Further, although silicon dioxide ($SiO_2$) film was used as the dielectric film having a first material, other dielectric films may be used instead.

When the dielectric film that has a first material is a silicon dioxide film, a case was described in which the dielectric film having a second material was L-Ox film, and the dielectric film having a third material was a SiOC film, but other dielectric films may be used as the dielectric films having second and third materials. For example, the dielectric films having second and third materials may be films that include at least one low-k film such as: a L-Ox film, a SiOC film, a silicon carbide (SiC) film, a SiOF film, a porous silicon dioxide ($SiO_2$) film, and a porous SiOC film.

Although a SiCN film was employed as the etching stopper film and copper diffusion prevention film, a SiC film or a SiN film may be used instead. A SiON film may also be used as the etching stopper film. When selecting the etching stopper film and copper diffusion prevention film from among the films that are here suggested, materials may be selected by comparing, for example, the dielectric constants and the etch selectivity, which is the ratio of the etch rates of the etching stopper film or copper diffusion prevention film and the film to be etched, and then selecting such that pattern processing is facilitated, and moreover, such that capacitance between interconnects is decreased.

In place of the dielectric film having a first material such as silicon dioxide ($SiO_2$) film 44 that is interposed in second upper copper layer 120, a film may be provided that contains a low-k film that is softer than a silicon dioxide film, such as a L-Ox film or a SiOC film. In this case as well, the shock resistance during bonding can be improved over a semiconductor device of the prior art.

In addition, a tantalum nitride (TaN) films can be used instead of titanium nitride (TiN) films for barrier metal that is provided below bonding pads 130. In either case, the diffusion of aluminum and copper can be prevented.

Further, each of the copper layers that constitute upper copper layer 100 and lower copper layer 200 and via-plugs can be materials that contain minute amounts of other elements such as silicon and aluminum.

According to the present invention as described hereinabove, copper layers, which have greater elasticity than oxide films (elasticity being the property by which force that is applied from the outside is repelled), are formed below bonding pads with barrier metal interposed, whereby a construction is obtained that repels force that is applied by a needle during probing and bonding and that impedes the transmission of shocks to areas below bonding pads. As a result, the shock resistance is improved, and damage to the pads when a probing needle is placed on a bonding pad can be prevented.

In addition, the provision of copper layers below bonding pads allows the ultrasonic waves for causing eutectic bonding between gold wires and bonding pads during bonding to be adequately transmitted to the gold wires and bonding pads without being absorbed by low-k films such as a L-Ox film. As a result, the close adhesion between gold wires and bonding pads is strengthened and the wire-pull strength is increased.

Finally, since the actual metal film thickness of the bonding pad portions is the sum of the film thicknesses of aluminum and the copper layer below the bonding pads, a device can be obtained having greater hardness against probing and bonding, and as a result, load that is exerted in the vicinity of the underlying L-Ox film is reduced and the occurrence of cracks in the interlevel dielectric films can be prevented.

While preferred embodiments of the present invention have been described using specific terms, such description is for illustrative purposes only, and it is to be understood that changes and variations may be made without departing from the spirit or scope of the following claims.

What is claimed is:

1. A semiconductor device, comprising:
   a bonding pad on a semiconductor substrate;
   an upper copper layer on a lower surface of said bonding pad with a barrier metal interposed; and
   a lower copper layer closer to said semiconductor substrate than said upper copper layer;
   wherein a copper area ratio of said lower copper layer under said bonding pad is lower than that of said upper copper layer, and
   wherein said lower copper layer is not electrically connected to said upper copper layer under said bonding pad.

2. A semiconductor device according to claim 1, wherein the copper area ratio of said upper copper layer is greater than that of other copper layers that are formed as circuit interconnects on said semiconductor substrate.

3. A semiconductor device according to claim 1, wherein the copper area ratio of said upper copper layer is at least 70%.

4. A semiconductor device according to claim 1, wherein the planar dimensions of said bonding pad and said upper copper layer are substantially equal.

5. A semiconductor device according to claim 1, wherein said upper copper layer is constituted by a plurality of copper layers.

6. A semiconductor device according to claim 5, wherein the copper area ratios of each copper layer of said upper copper layer are substantially the same.

7. A semiconductor device according to claim 5, further comprising:
   interlevel dielectric films that are provided between each of the copper layers of said upper copper layer; and
   via-plugs composed of copper that are embedded in said interlevel dielectric films;
   wherein each of the copper layers of said upper copper layer are connected by way of said via-plugs.

8. A semiconductor device according to claim 7, wherein the copper layer pattern of the copper layer that is positioned uppermost in said upper copper layer and said via-plugs that are connected to the copper layer pattern are embedded in a dielectric film that is composed of a first material.

9. A semiconductor device according to claim 1, wherein the copper area ratio of said lower copper layer is at least 15% and not greater than 95%.

10. A semiconductor device according to claim 8, wherein said lower copper layer is constituted by a plurality of copper layers.

11. A semiconductor device according to claim 10, wherein each of the copper layers of said lower copper layer are constituted by a copper pattern that is embedded in a dielectric film that is composed of a second material having a lower relative dielectric constant than said first material.

12. A semiconductor device comprising:
   a bonding region in which a bonding pad is formed;
   an internal circuit region provided inside of said bonding region, said internal circuit region having a multilevel wiring structure that includes a plurality of copper interconnect layers at a first level and a plurality of copper interconnect layers at second level; and
   an upper copper layer formed in said bonding region above said internal circuit region and under said bonding pad in electrical contact therewith, said upper copper layer being electrically isolated from said internal circuit region.

13. The device as claimed in claim 12, wherein one of said copper interconnect layers at said second level is further elongated from said internal circuit region to said bonding region under said upper copper layer in electrical isolation from said upper copper layer and from one of said copper interconnect layers at said first level.

14. The device as claimed in claim 12, wherein said upper copper layer includes first and second copper layers and a via-plug sandwiched therebetween.

15. The device as claimed in claim 14, further comprising a plurality of copper interconnect layers at a third level and a plurality of copper interconnect layers at a fourth level, said first copper layer being formed at said third level and said second copper layer being formed at said fourth level.

16. The device as claimed in claim 15, wherein said bonding pad is in electrical contact with said second copper layer, and one of said copper interconnect layers at said fourth level has an electrical contact with said second copper layer.

17. The device as claimed in claim 13, wherein said upper copper layer includes first and second copper layers and a via-plug sandwiched therebetween, and said bonding pad is in electrical contact with said second copper layer.

18. The device as claimed in claim 17, further comprising a plurality of copper interconnect layers at a third level and a plurality of copper interconnect layers at a fourth level, said first copper layer being formed at said third level and said second copper layer being formed at said fourth level.

19. The device as claimed in claim 18, wherein said bonding pad is in electrical contact with said second copper layer via a barrier metal layer and one of said copper interconnect layers at said fourth level has an electrical contact with said second copper layer.

20. The semiconductor device according to claim 1, wherein the upper copper layer is separated from the lowest surface of said bonding pad only by the barrier metal.

21. The device as claimed in claim 12, wherein said upper copper layer is separated from the lowest surface of said bonding pad only by a layer of a barrier metal.

* * * * *